(12) United States Patent
Yamada

(10) Patent No.: US 10,908,224 B2
(45) Date of Patent: Feb. 2, 2021

(54) DETERIORATION SUPPRESSION DEVICE FOR SECONDARY BATTERY AND INDIVIDUAL DETERIORATION SUPPRESSION DEVICE

(71) Applicant: NTN CORPORATION, Osaka (JP)

(72) Inventor: Hiroyuki Yamada, Iwata (JP)

(73) Assignee: NTN CORPORATION, Osaka (JP)

( * ) Notice: Subject to any disclaimer, the term of this patent is extended or adjusted under 35 U.S.C. 154(b) by 211 days.

(21) Appl. No.: 16/138,176

(22) Filed: Sep. 21, 2018

(65) Prior Publication Data

US 2019/0033390 A1 Jan. 31, 2019

Related U.S. Application Data

(63) Continuation of application No. PCT/JP2017/010718, filed on Mar. 16, 2017.

(30) Foreign Application Priority Data

Mar. 22, 2016 (JP) .................................. 2016-056763

(51) Int. Cl.
*H02J 7/02* (2016.01)
*G01R 31/392* (2019.01)
(Continued)

(52) U.S. Cl.
CPC ........... *G01R 31/392* (2019.01); *G01R 31/36* (2013.01); *G01R 31/382* (2019.01);
(Continued)

(58) Field of Classification Search
CPC ...................................................... H02J 7/00
See application file for complete search history.

(56) References Cited

U.S. PATENT DOCUMENTS 7,362,074 B2 4/2008 Iwane et al.
8,030,898 B2 10/2011 Okuto
(Continued)

FOREIGN PATENT DOCUMENTS

JP 9-113588 5/1997
JP 10-170615 6/1998
(Continued)

OTHER PUBLICATIONS

English Translation by WIPO of the International Preliminary Report on Patentability dated Oct. 4, 2018 in International Patent Application No. PCT/JP2017/010718, 9 pgs.
(Continued)

*Primary Examiner* — Robert Grant

(57) ABSTRACT

This secondary battery degradation suppression device configured to suppress degradation of each of a plurality of batteries connected in series in a power supply includes a plurality of individual degradation suppression devices. Each individual degradation suppression device includes: a voltage measurement section configured to measure DC voltage between terminals of the battery; a comparison section configured to compare measured voltage with a threshold and determine whether the voltage is higher than the threshold; and a discharge section configured to discharge the battery when the comparison section has determined that the voltage is higher than the threshold. The discharge section includes: a discharging circuit connected in parallel to the battery; and a discharge management section configured to control the discharging circuit. The discharging circuit is implemented as a series circuit of a current limiting resistor and a switch.

10 Claims, 8 Drawing Sheets

(51) Int. Cl.
*H01M 10/48* (2006.01)
*H01M 10/44* (2006.01)
*H02J 7/00* (2006.01)
*G01R 31/36* (2020.01)
*G01R 31/389* (2019.01)
*G01R 31/382* (2019.01)

(52) U.S. Cl.
CPC .......... *G01R 31/389* (2019.01); *H01M 10/44* (2013.01); *H01M 10/441* (2013.01); *H01M 10/48* (2013.01); *H01M 10/482* (2013.01); *H02J 7/00* (2013.01); *H02J 7/007* (2013.01); *H02J 7/0026* (2013.01); *H02J 7/02* (2013.01)

(56) References Cited

U.S. PATENT DOCUMENTS

| | | | |
|---|---|---|---|
| 8,723,481 | B2 * | 5/2014 | Zhang ................. H01M 10/441 320/116 |
| 9,142,981 | B2 | 9/2015 | Kamata et al. |
| 2006/0186890 | A1 | 8/2006 | Iwane et al. |
| 2009/0128094 | A1 | 5/2009 | Okuto |
| 2013/0088202 | A1 | 4/2013 | Kamata et al. |
| 2015/0253204 | A1 | 9/2015 | Hebiguchi |

FOREIGN PATENT DOCUMENTS

| | | |
|---|---|---|
| JP | 2005-100969 | 4/2005 |
| JP | 2007-181365 | 7/2007 |
| JP | 2009-124933 | 6/2009 |
| JP | 2010-164441 | 7/2010 |
| JP | 2013-85354 | 5/2013 |
| JP | 2013-188039 | 9/2013 |
| WO | WO 2014/076839 A1 | 5/2014 |
| WO | WO 2014/108971 A1 | 7/2014 |

OTHER PUBLICATIONS

U.S. Appl. No. 16/144,576, filed Sep. 27, 2018, Hiroyuki Yamada, NTN Corporation.
U.S. Appl. No. 16/206,179, filed Nov. 30, 2018, Hiroyuki Yamada, NTN Corporation.
"AC 4-Terminal-Method Battery Tester, Internal Resistance Measuring Instrument", IW7807-BP (Rev. 1.7.1, Feb. 16, 2015, Tokyo Devices), https://tokyodevices.jp/system/attachments/files/000/000/298/original/IW7807-BP-F_MANUAL.pdf.
International Search Report dated Apr. 18, 2017 in corresponding International Patent Application No. PCT/JP2017/010718.
U.S. Appl. No. 16/103,395, filed Aug. 14, 2018, Hiroyuki Yamada, NTN Corporation.
U.S. Appl. No. 16/134,267, filed Sep. 18, 2018, Hiroyuki Yamada, NTN Corporation.
Notice of Reasons for Refusal, dated Apr. 14, 2020, in corresponding Japanese Application No. 2016-056763 (14 pp).
Notification of Reasons for Refusal, dated Dec. 1, 2020, in corresponding Japanese Application No. 2016-056763 (10 pp.).

* cited by examiner

DETERIORATION SUPPRESSION DEVICE FOR SECONDARY BATTERY AND INDIVIDUAL DETERIORATION SUPPRESSION DEVICE

CROSS REFERENCE TO THE RELATED APPLICATION

This application is a continuation application, under 35 U.S.C. § 111(a), of international application No. PCT/JP2017/010718, filed Mar. 16, 2017, which is based on and claims Convention priority to Japanese patent application No. 2016-056763, filed Mar. 22, 2016, the entire disclosure of which is herein incorporated by reference as a part of this application.

BACKGROUND OF THE INVENTION

Field of the Invention

The present invention relates to a secondary battery deterioration or degradation suppression device for batteries and an individual deterioration or degradation suppression device which each suppress deterioration or degradation of each of the batteries during charging or the like. Such devices are used in data centers, mobile phone base stations, or other various types of emergency power supplies for which stable electric power supply is required, or in general power supplies in which a plurality of batteries are connected in series.

Description of Related Art

In data centers, mobile phone base stations, or the like, stable supply of electric power is important. Although a commercial AC power supply is used during steady operation, such a data center, a mobile phone base station, or the like is provided with an emergency power supply in which a secondary battery is used, as an uninterruptible power supply device, for a case where the commercial AC power supply stops. Charging methods for the emergency power supply includes: a trickle charging type in which charging is carried out with a minute current by use of a charging circuit during steady operation; and a float charging type in which a load and a secondary battery are connected in parallel to a rectifier, and charging is carried out while the load is being operated with a constant current being applied. In general, the trickle charging type is more often employed in the emergency power supply.

The emergency power supply is required to have voltage and current that allow driving of a load that is driven by the commercial power supply. Since a single secondary battery (also referred to as battery) has low voltage and a small capacity, the emergency power supply is configured such that a plurality of battery groups are connected in parallel, each battery group including a plurality of batteries that are connected in series. The individual battery is a lead storage battery, a lithium ion battery, or the like.

In such an emergency power supply, the voltages of the batteries decrease due to degradation. Therefore, in order to ensure reliability, it is desired that degradation determination of each battery is performed and any battery that has been degraded is replaced. However, there has been no proposal of a device that can perform accurate degradation determination on a large number of batteries in a large-scale emergency power supply such as in a data center, a mobile phone base station, or the like.

Examples of proposals regarding conventional battery degradation determination include: a proposal of an on-vehicle battery checker that performs measurement on the entire battery (for example, Patent Document 1); a proposal in which a pulse-shaped voltage is applied to a battery and the internal impedance of the entire battery is calculated from an input voltage and a response voltage (for example, Patent Document 2); and a proposal of a method in which internal resistance of each of individual cells connected in series in a battery is measured, whereby degradation is determined (for example, Patent Document 3). For measurement of the internal resistance of each individual cell, an AC 4-terminal-method is used. As a handy checker that measures a very small resistance value such as internal resistance of a battery, an AC 4-terminal-method battery tester has been commercialized (for example, Non-Patent Document 1).

In Patent Documents 1 and 2 mentioned above, wireless data transmission is also proposed, and in addition, reduction of handling work of cables and manual operation, and data management by computers are also proposed.

RELATED DOCUMENT

Patent Document

[Patent Document 1] JP Laid-open Patent Publication No. H10-170615
[Patent Document 2] JP Laid-open Patent Publication No. 2005-100969
[Patent Document 3] JP Laid-open Patent Publication No. 2010-164441

Non-Patent Document

[Non-Patent Document 1] AC 4-terminal-method battery tester, internal resistance measuring instrument IW7807-BP (Rev.1.7.1, Feb. 16, 2015, Tokyo Devices) (https://tokyodevices.jp/system/attachments/files/000/000/298/orginal/IW7807-BP-F_MANUAL.pdf)

SUMMARY OF THE INVENTION

As described above, various degradation determination devices and determination methods have been proposed. However, there is a possibility that difference in the degradation degree of individual batteries causes acceleration of, during charging, degradation of some batteries of which degradation has progressed. This will be specifically described.

Most emergency power supplies have batteries connected in series to be used, and charged states thereof are always maintained by float charging or trickle charging. When a battery is degraded, internal resistance increases, and thus, voltage between terminals increases. In a case of a series connection, charging voltage at opposite ends is set in accordance with the number of batteries that are connected in series, but voltage between terminals of individual batteries varies under influence of the internal resistance. There are cases where voltage between terminals of a battery of which degradation has progressed increases, resulting in an overvoltage state. That is, there is a possibility that the degraded battery is further degraded, whereby degradation thereof is accelerated.

Not only when charging voltage is applied to opposite ends of a battery group in which a plurality of batteries are connected in series, but also when, for example, voltage is individually applied from each voltage sensor to a corresponding battery by a 4-terminal-method or the like at the time of voltage measurement for degradation determination, there is a possibility that difference in the degradation degree of the individual batteries causes acceleration of degradation of some batteries of which degradation has progressed, as mentioned above.

An object of the present invention is to provide a secondary battery degradation suppression device and an individual degradation suppression device which each can prevent degradation of some batteries of which degradation has progressed, from being accelerated during charging or the like due to difference in the degradation degree of individual batteries.

Hereinafter, in order to facilitate understanding of the present invention, the present invention will be described with reference to the reference numerals used in embodiments, for the sake of convenience.

A secondary battery degradation suppression device of the present invention is a secondary battery degradation suppression device configured to suppress degradation of batteries 2 in a power supply 1 where the plurality of batteries 2 connected in series, each battery 2 being a secondary battery, the secondary battery degradation suppression device including a plurality of individual degradation suppression devices 7 connected to the respective batteries, wherein each individual degradation suppression device 7 includes:
  a voltage measurement section 21 (DC voltage measurement section 26, for example) configured to measure DC voltage between terminals of the battery 2;
  a comparison section 31 configured to compare, with a threshold, the voltage measured by the voltage measurement section 21 and determine whether the voltage is higher than the threshold; and
  a discharge section 30 configured to discharge the battery 2 when the comparison section 31 has determined that the voltage is higher than the threshold.

The voltage measurement section 21 is, for example, the part, in the voltage sensor that directly pertains to voltage measurement. "Whether the voltage is higher than a threshold" may be determined on the basis of whether the voltage exceeds the threshold, or may be determined on the basis of whether the voltage is greater than or equal to the threshold.

According to this configuration, at voltage application such as during charging or the like, the comparison section 31 compares, with a threshold, the DC voltage measured by the voltage measurement section 21 (hereinafter, also referred to as DC voltage) and determines whether the DC voltage is higher than the threshold. When the comparison section 31 has determined that the DC voltage is higher than the threshold, the discharge section 30 discharges the battery 2. When a battery 2 is degraded, the internal resistance increases, and thus, voltage between terminals increases. Therefore, if any battery 2 that has a high measured voltage is discharged, voltages of the batteries 2 connected in series can be equalized. Accordingly, degradation of some batteries 2 of which degradation has progressed can be prevented from being accelerated during charging or the like. With respect to application of voltage to the batteries 2, not only in a case where charging voltage is applied to opposite ends of a battery group 3 in which the batteries 2 are connected in series, but also in a case where charging voltage is applied to each individual battery 2 as in such a case where resistance measurement is performed by a 4-terminal-method, the degradation prevention effect due to discharge as mentioned above can be obtained. As the voltage measurement section 21, for example, a device that is used in AC voltage measurement when degradation determination is performed on the battery 2 may be used also in monitoring performed for determination regarding DC voltage, which is the voltage between terminals (cell voltage).

When a cell having a working voltage of 2 V is used as the battery 2, the normal range of the voltage of the cell is, in general, 1.8 to 2.23 V, for example. In such a case, when the battery 2 is implemented as one cell, if the threshold is set to, for example, the upper limit value 2.23 V, or about 2.23 to 2.4 V a little over the upper limit value in consideration of voltage increase due to internal resistance and charge current, any battery 2 that has been degraded can be discriminated. It is also possible to determine degradation during charging on the basis of relative values among the batteries. In this case, the threshold may be set to an intermediate value in the above-mentioned normal range and not greater than 2.23 V.

In a case of a lead storage battery, the upper limit voltage of the normal range is 2.23 V. In a case of trickle charging, charge is always performed. Thus, to this voltage, voltage due to internal resistance and charge current is added, and the threshold becomes greater than 2.23 V. In this method, even while charge is being performed, with respect to the batteries connected in series for which shared charge current is used, voltage between terminals can be monitored and relative degradation determination can be performed. Therefore, the threshold can be set to 2.23 V or lower.

In the present invention, the discharge section 30 may include: a discharging circuit 35 implemented as a series circuit of a current limiting resistor 36 and a switch 37 and connected in parallel to the battery 2; and a discharge management section 22 configured to control the discharging circuit 35. Further, this discharge management section 22 may include: the comparison section 31; and a discharge processing section 32 configured to turn on the switch 37 when the comparison section 31 has determined that the measured voltage is higher than the threshold, and to turn off the switch after a set time period. If the discharge section 30 is configured by the discharging circuit 35 and the discharge management section 22 and the discharging circuit 35 is configured by the current limiting resistor 36 and the switch 37, it is possible to cause the current limiting resistor 36 to consume electric power, thereby decreasing the battery voltage, and it is possible to control the voltage decrease by means of the switch 37. Accordingly, the discharge can be appropriately performed in a simple manner. In addition, since the discharge management section 22 is configured to turn off the discharge on the basis of a set time period, appropriate discharge can be performed by use of a simple component such as a timer.

When the discharge section 30 is configured as described above, the discharge management section 22 may include a discharge processing section 32 configured to turn on the switch 37 to connect the battery 2 and the current limiting resistor 36 when the comparison section 31 has determined that the measured voltage is higher than the threshold. While the switch 37 is on, the discharge processing section 32 temporarily turns off the switch 37 at a predetermined or constant interval to allow voltage measurement by the voltage measurement section 21 and comparison by the comparison section 31 to be performed again. The discharge processing section 32 maintains an off-state of the switch 37 when the comparison section 31 has determined that the measured voltage is lower than the threshold, and turn on the switch 37 again, when the comparison section 31 has determined that the measured voltage is higher than the threshold, thereby to repeat processes of the temporary turning off at the constant interval, the allowing of voltage measurement and comparison. In this configuration, the discharge management section 22 temporarily turns off the switch 37 at a constant interval while discharge is performed, thereby allowing voltage measurement to be performed, compares the measured battery voltage with a threshold, and then ends the discharge. Thus, compared with a case where the discharge time period is controlled by use of a timer, voltage after the discharge of the battery 2 can be accurately obtained. Accordingly, prevention of degradation of the battery 2 can be more assuredly realized.

In this configuration, the secondary battery degradation suppression device may include a number-of-times management section 33 configured to count the number of times of discharge in which the switch 37 is turned on through repetition of the processes performed by the discharge processing section 32, and to cause a warning portion to issue a warning when the number of times of discharge has reached a set value. When appropriate voltage is not attained even after discharge is repeated many times, it is the case in which a certain abnormality has occurred. Therefore, by causing the warning portion to issue a warning, the abnormality can be can quickly recognized by an operator, and countermeasures can be taken early. "The number of times of discharge has reached a set value" may be determined on the basis of whether the number of times of discharge exceeds a set value, or may be determined on the basis of whether the number of times of discharge is greater than or equal to the set value.

In the present invention, when the discharge section 30 includes a discharging circuit 35 implemented as a series circuit of a current limiting resistor 36 and a switch 37 and connected in parallel to the battery 2, the current limiting resistor 36 and the switch 37 may be mounted on a common circuit board 7A as that of the voltage measurement section 21. The current limiting resistor 36, the switch 37, and the voltage measurement section 21 may be implemented as one chip. When the voltage measurement section 21, the current limiting resistor 36, and the switch 37 are mounted on the common circuit board 7A, the configuration of the degradation suppression device can be formed in a simpler and more compact manner.

In the present invention, when the discharge section 30 includes a discharging circuit 35 implemented as a series circuit of a current limiting resistor 36 and a switch 37 and connected in parallel to the battery 2, the discharging circuit 35 and a circuit, connected to the battery 2, of the voltage measurement section 21 may be connected to a common cable 38. If the circuit that connects the current limiting resistor 36 and the switch 37, of the discharging circuit 35, to the battery 2 and the circuit that connects the voltage measurement section 21 to the battery 2 are connected to the common cable 38, the wiring system is simplified.

In the present invention, the voltage measurement section 21 may have a function of measuring voltage of an AC component applied between terminals of the battery 2. When the voltage measurement section 21 can measure voltage of the AC component applied to the battery 2, the internal resistance of the battery 2 can be calculated from the voltage value of the AC component. If this internal resistance is compared with a threshold or the like, degradation of the battery 2 can be determined. Therefore, it is possible to cause the secondary battery degradation suppression device to also serve as a degradation determination device.

In this configuration, the secondary battery degradation suppression device may include a wireless communication section configured to wirelessly transmit the voltage of the AC component measured by the voltage measurement section 21. When a plurality of batteries 2 are connected in series, a bias is applied such that the farther a battery 2 is separated from the grounding point, the greater the negative potential becomes, and thus, it is necessary to take into consideration the reference potential (ground level) [volt]. However, if wireless transmission is performed, there is no need to take into consideration the reference potential.

In the secondary battery degradation suppression device of the present invention, the comparison section 31 may calculate an average value of DC voltages of all the batteries 2 connected in series and measured by the respective individual degradation suppression devices 7 (voltage measurement sections 21, for example), and may obtain the threshold by adding a set addition value to the calculated average value. The appropriate voltage range slightly varies depending on individual power supplies. Therefore, in a case where the average value is used, it is possible to perform discharge such that more appropriate voltage can be attained for the power supply 1 subjected to degradation suppression, than in a case where a threshold is predetermined in advance. Accordingly, degradation suppression can be more assuredly realized.

The secondary battery degradation suppression device of the present invention may include: a measurement current application portion 9 configured to apply current having an AC component to a battery group 3 in which a plurality of the batteries 2 are connected in series; an internal resistance calculation section 13a configured to calculate an internal resistance of each battery 2 on the basis of voltage of the AC component measured by the voltage measurement section 21; and a determination section 13b configured to determine degradation of the battery 2 on the basis of the internal resistance calculated by the internal resistance calculation section 13a. Due to the provision of the measurement current application portion, the internal resistance calculation section 13a, and the determination section 13b, degradation determination of the battery 2 can be accurately performed.

A secondary battery individual degradation suppression device 7 according to the present invention configured to suppress degradation of a battery 2 which is a secondary battery may include:

a voltage measurement section 21 configured to measure DC voltage between terminals of the battery 2;

a comparison section 31 configured to compare, with a threshold, the voltage measured by the voltage measurement section 21 and determine whether the voltage is higher than the threshold; and a discharge section 30 configured to discharge the battery 2 when the comparison section 31 has determined that the voltage is higher than the threshold.

The discharge section 30 may include:
  a discharging circuit 35 implemented as a series circuit of
    a current limiting resistor 36 and a switch 37 and
    connected in parallel to the battery 2: and
  a discharge management section 22 configured to control
    the discharging circuit 35, and
  the discharge management section 22 may include
  the comparison section 31 and
  a discharge processing section 32 configured to turn on
    the switch 37 to start discharge when the comparison
    section 31 has determined that the voltage is higher than the threshold, and configured to stop a discharge process when a predetermined discharge condition is satisfied.

The case where "a predetermined discharge condition is satisfied" may be, for example, that a set time period has lapsed, or that the battery voltage becomes lower than a set voltage.

Each of the secondary battery degradation suppression devices having the above configurations includes a plurality of individual degradation suppression devices 7. However, even when the individual degradation suppression device 7 is used singly, the effect of suppressing degradation of the battery 2 as mentioned above can be obtained.

Any combination of at least two constructions, disclosed in the appended claims and/or the specification and/or the accompanying drawings should be construed as included within the scope of the present invention. In particular, any combination of two or more of the appended claims should be equally construed as included within the scope of the present invention.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DESCRIPTION OF EMBODIMENTS

Figure 1:
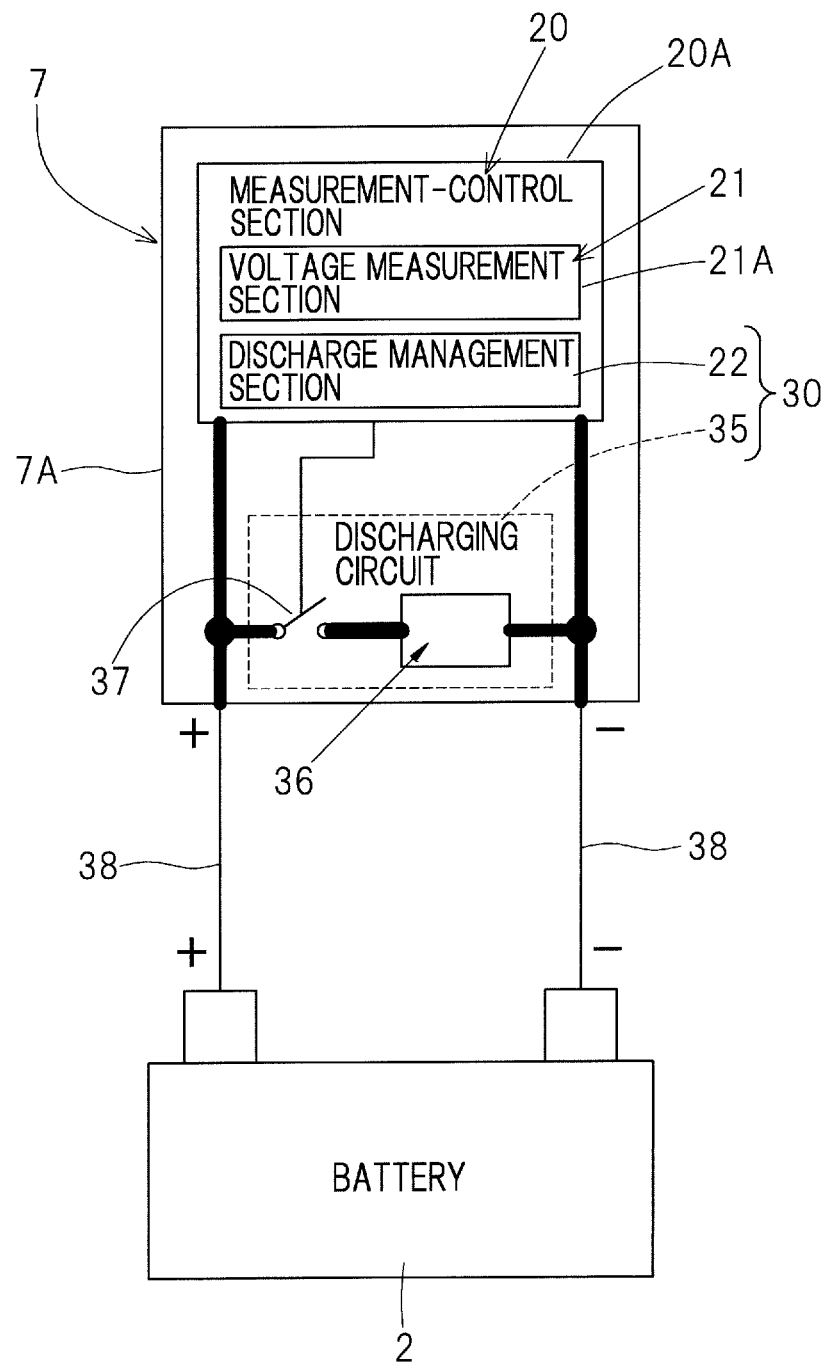
FIG. 1 is an explanatory diagram showing the outline of an example in which an individual degradation suppression device in a secondary battery degradation suppression device according to one embodiment of the present invention is implemented as a voltage sensor for detecting degradation.

One embodiment of the present invention is described with reference to FIG. 1 to FIG. 8. FIG. 1 is an explanatory diagram showing the outline of an example in which an individual degradation suppression device in this secondary battery degradation suppression device is implemented as a voltage sensor 7 for detecting degradation. FIG. 6 is a circuit diagram of a degradation suppression device which also serves as a degradation determination device including a plurality of voltage sensors 7.

In FIG. 6, a power supply 1 to be subjected to degradation suppression and degradation determination is an emergency power supply in data centers, mobile phone base stations, or other various types of power supply devices for which stable electric power supply is required. The power supply 1 has a plurality of battery groups 3, each including a plurality of batteries 2 that are connected in series, each battery 2 being a secondary battery. These battery groups 3 are connected in parallel, and are connected to a load 4. Each battery 2 may be a battery that includes only one cell, or may be a battery in which a plurality of cells are connected in series. In this example, each battery 2 is implemented as one cell.

A main power supply 5 has positive and negative terminals 5A and 5B connected to the positive and negative terminals of the load 4. The emergency power supply 1 is connected via a charging circuit 6 and a diode 15 to the positive terminal 5A, and is directly connected to the negative terminal 5B, of the main power supply 5. The diode 15 is connected in parallel to the charging circuit 6 in the direction in which current is caused to flow from the emergency power supply 1 to the load 4. The main power supply 5 is implemented as a DC power supply or the like which is connected to, for example, a commercial AC power supply via a rectification circuit and a smoothing circuit (both not shown), and which converts AC power into DC power.

The positive potential of the emergency power supply 1 is lower than the positive potential of the main power supply 5, and does not normally cause flow to the load 4. However, when the main power supply 5 stops or the function thereof decreases, the potential at the main power supply 5 side decreases, and thus, feeding is performed via the diode 15 to the load 4 by use of electric charge stored in the emergency power supply 1. The charging type in which the charging circuit 6 is connected as described above is called a trickle charging type.

This secondary battery degradation suppression device suppresses each battery 2 in the power supply 1 from being degraded during charging, and is formed by voltage sensors 7 for determining degradation. A plurality of voltage sensors 7 are individually connected to the respective batteries 2.

A secondary battery degradation determination device including this degradation suppression device includes, in addition to the plurality of voltage sensors 7, a plurality of current sensors 8 respectively connected to the battery groups 3 and a measurement current application portion 9 which applies measurement current containing an AC component, to each battery group 3. The secondary battery degradation determination further includes a wireless communication section 24 which is provided to each voltage sensor 7 and which wirelessly transmits a measurement value of voltage of the AC component that has been measured and a controller 11. The controller 11 receives the measurement value transmitted by each wireless communication section 24, and calculates an internal resistance of each battery 2 by use of the received measurement value, to determine degradation of the battery 2 on the basis of the internal resistance. In this example, the controller 11 is composed of a main controller 11A and a data server 13.

Specifically, the controller 11 or each component therein is configured by software functions on a processor (not shown) or hardware circuits that can output results by performing calculation using: LUTs (look up table) realized by software or hardware; or predetermined transform functions stored in a software library, hardware equivalent thereto, and the like; and, if necessary, comparison functions, arithmetic operation functions in a library, hardware equivalent thereto, and the like (hereinafter, referred as implementation model).

The measurement current application portion 9 is implemented as a discharging device or a charging device for applying predetermined current to each battery group 3 of the power supply 1. The measurement current application portion 9 is connected to the positive and negative terminal ends of each battery group 3, and provides the power supply 1 with current that has an AC component that changes in a pulse shape or a sine wave shape, such as a ripple current, for example.

The voltage sensor 7 which also serves as the individual degradation suppression device is described with reference to FIG. 1 and FIG. 2. The voltage sensor 7 includes a measurement-control section 20 and a discharging circuit 35. The measurement-control section 20 is provided with a voltage measurement section 21 which measures voltage of the battery 2, and a discharge management section 22 which controls the discharging circuit 35 in accordance with the measured voltage. The discharge management section 22 and the discharging circuit 35 form a discharge section 30. The voltage measurement section 21 is the part, in the voltage sensor 7, that directly pertains to voltage measurement, or the part indispensable to voltage measurement, and is the part excluding additional configurations. It should be noted that the voltage measurement section 21 may be referred to as a voltage sensor, and the voltage sensor 7 may be referred to as a sensor unit 7.

The discharging circuit 35 is implemented as a series circuit of a current limiting resistor 36 and a switch 37, and is connected in parallel to the battery 2. The current limiting resistor 36 is also referred to as bleeder resistor. The switch 37 is implemented as a semiconductor switching element such as a transistor. The measurement-control section 20 including the voltage measurement section 21 is driven by electric power of the battery 2 subjected to degradation determination. The circuit that feeds the measurement-control section 20 from the battery 2 is connected to positive and negative cables 38 that are the same as those for the circuit forming the discharging circuit 35.

Figure 2:
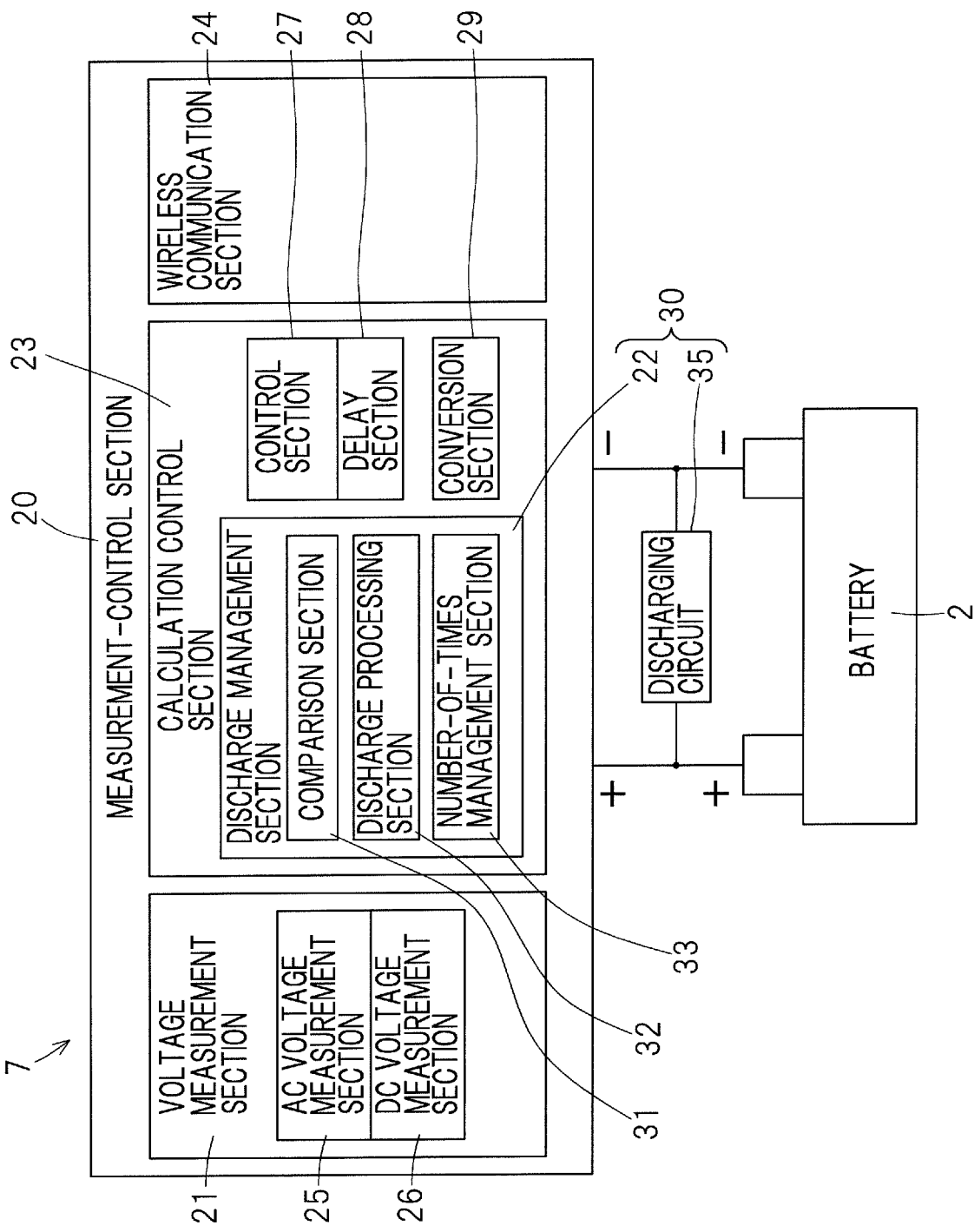
FIG. 2 is a block diagram showing a conceptual configuration of the voltage sensor.
Figure 3:
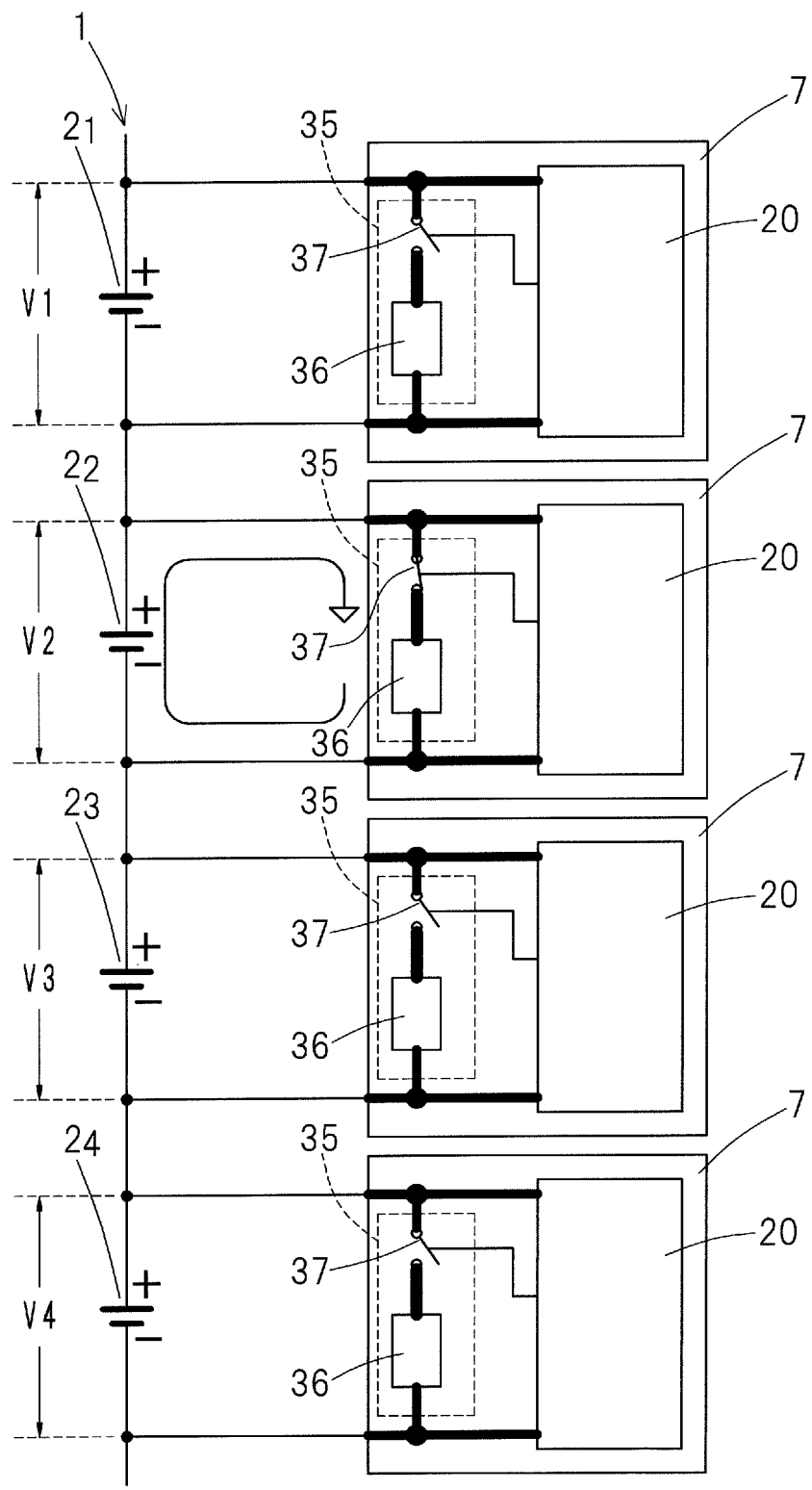
FIG. 3 is an explanatory diagram showing a state in which the voltage sensors are provided in parallel.

Specifically, as shown in FIG. 2, the measurement-control section 20 is composed of the voltage measurement section 21, a calculation control section 23, and the wireless communication section 24. The calculation control section 23 is implemented as a calculation processing device such as a microcomputer.

Specifically, the calculation control section 23 or each component therein is configured by software functions on a processor (not shown) or hardware circuits that can output results by performing calculation using the implementation model described above.

The voltage measurement section 21 has a function of measuring voltage (AC voltage) of an AC component that acts between the terminals of the battery 2, and a function of measuring voltage (DC voltage) of a DC component. The part that has the function of measuring AC voltage is indicated as an AC voltage measurement section 25, and the part that has the function of measuring DC voltage is indicated as a DC voltage measurement section 26. The AC voltage measurement section 25 is used for degradation determination for the battery 2, and the DC voltage measurement section 26 is used for degradation suppression and degradation determination.

The calculation control section 23 includes the discharge management section 22, a control section 27, a delay section 28, and a conversion section 29. The control section 27, the delay section 28, and the conversion section 29 are used in degradation determination, and are described later. The discharge management section 22 includes: a comparison section 31 which compares, with a threshold, the DC voltage of the battery 2 measured by the voltage measurement section 21 and determines whether the DC voltage is higher than the threshold; a discharge processing section 32 which discharges the battery 2 when the comparison section 31 has determined that the measured (DC) voltage is higher than the threshold; and a number-of-times management section 33. The number-of-times management section 33 counts the number of times of repetition of discharge performed by the discharge processing section 32, and causes a warning portion to issue a warning when the number of times of discharge has exceeded a set value.

Figure 4:
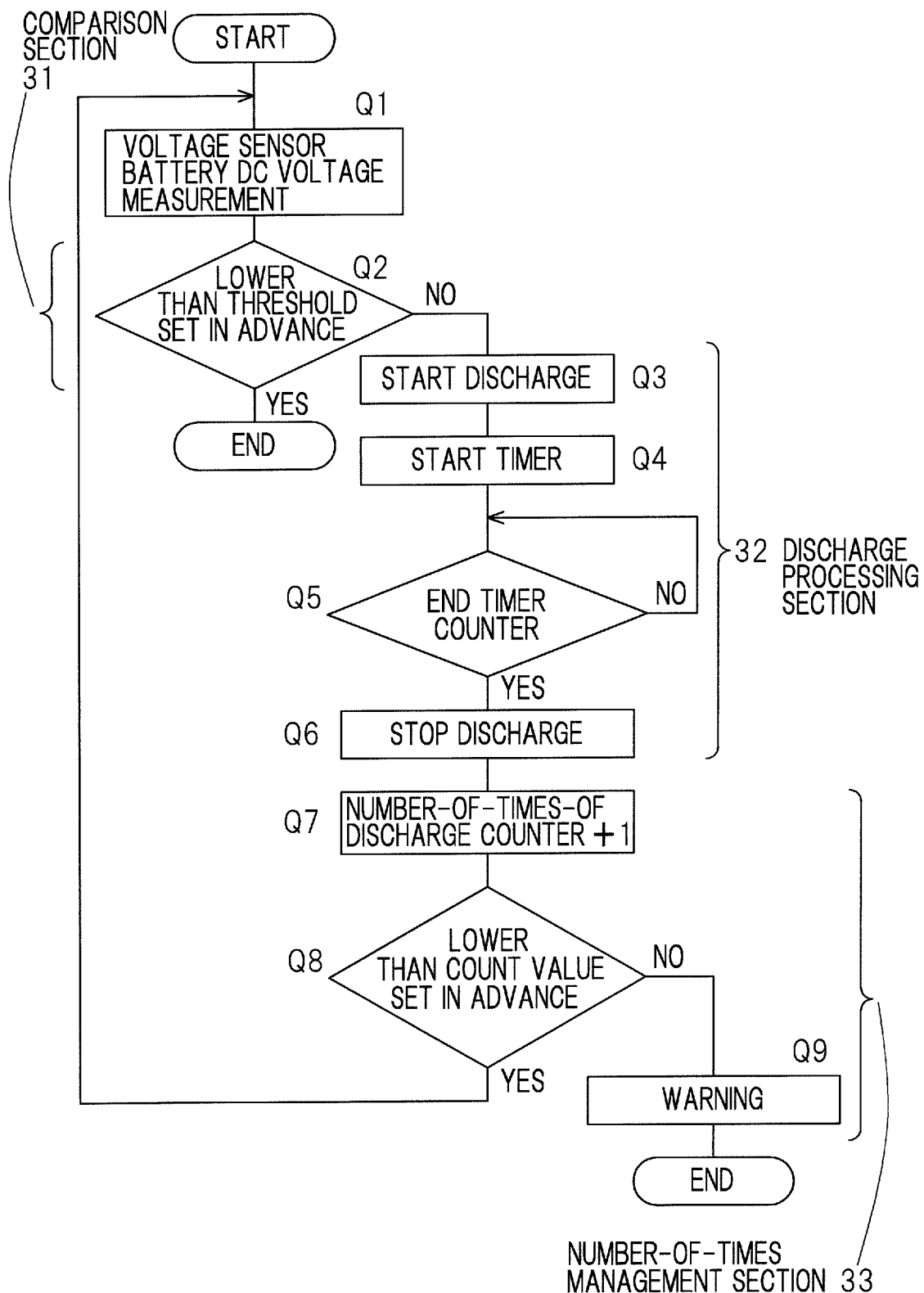
FIG. 4 is a flow chart showing an example of operation performed by the degradation suppression device.
Figure 5:
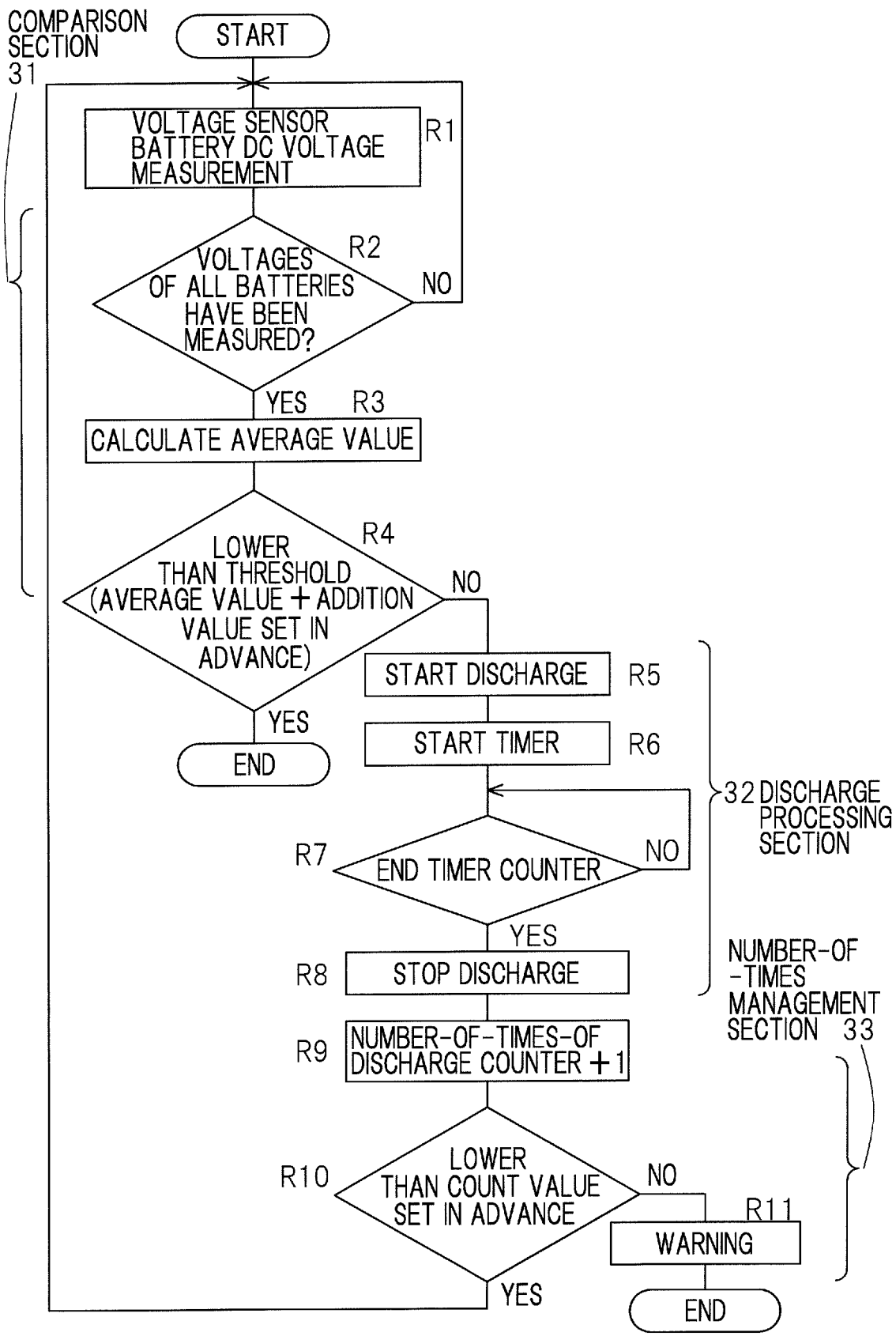
FIG. 5 is a flow chart of another example of operation performed by the degradation suppression device.
Figure 6:
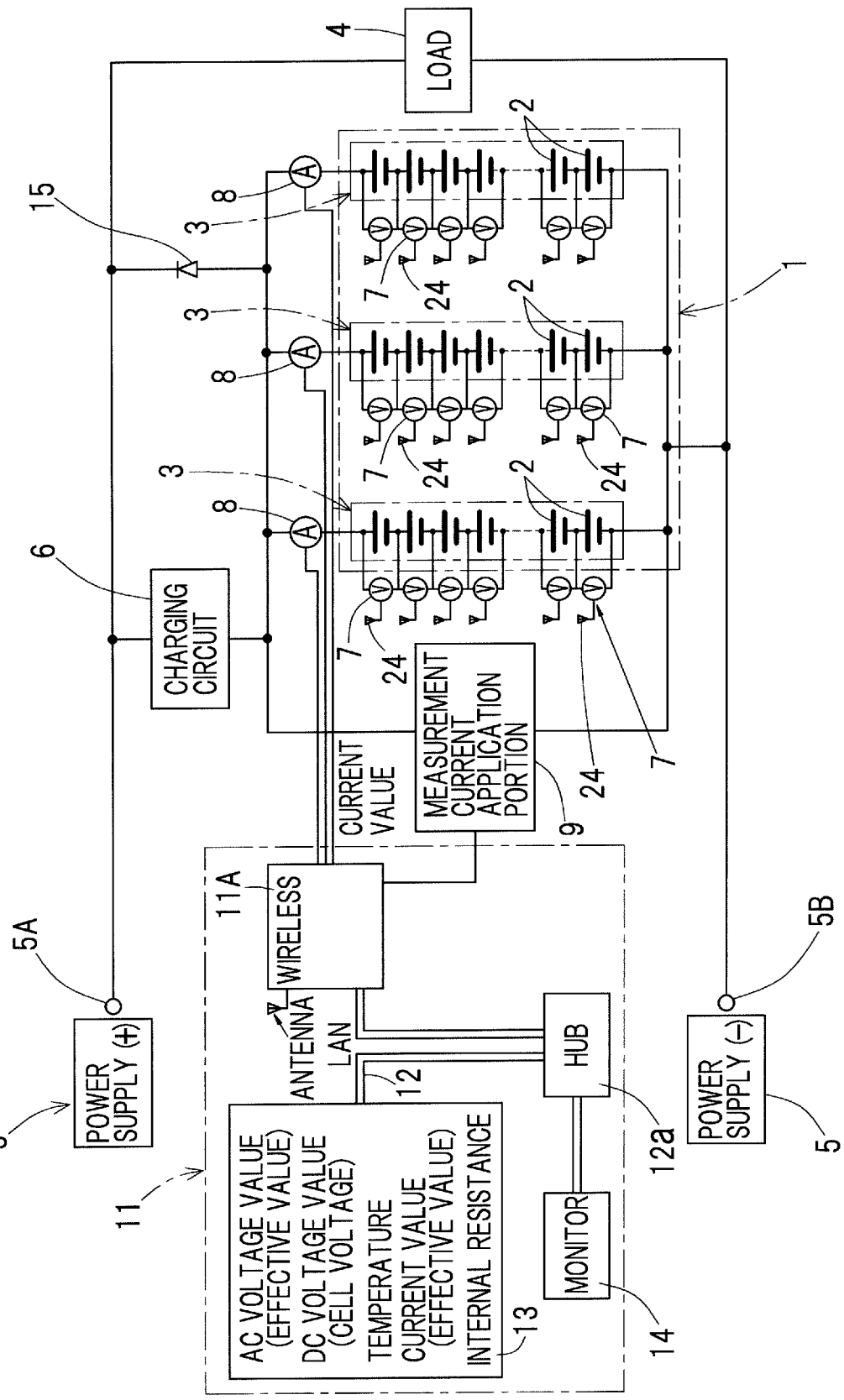
FIG. 6 is a circuit diagram of a secondary battery degradation determination device provided with the secondary battery degradation suppression device.

Examples of degradation suppressing operation performed by the degradation suppression device having the configuration described above are respectively shown in the flow charts in FIG. 4 and FIG. 5. Degradation determination will be described later with reference to FIGS. 6 to 8. In the example shown in FIG. 4, step Q2 is performed by the comparison section 31, steps Q3 to Q6 are performed by the discharge processing section 32, and steps Q7 to Q9 are performed by the number-of-times management section 33.

In step Q1 shown in FIG. 4, DC voltage of the battery 2 is measured by the voltage measurement section 21 of the voltage sensor 7. The comparison section 31 (FIG. 2, FIG. 4) of the discharge management section 22 (FIG. 1, FIG. 2) compares the measured DC voltage with a threshold set in advance (step Q2), and when the measured DC voltage is lower than the threshold, the process ends. The threshold is, for example, a value that is determined as an upper limit for a normal range for voltage of the battery 2. When the measured DC voltage is lower than the threshold, the battery 2 can be considered to be normal, and thus, no discharging process is performed and the process ends.

When the measured DC voltage is higher than the threshold, the discharge processing section 32 turns on the switch 37 to start discharge (step Q3), and starts a timer (not shown) of the discharge processing section 32 (step Q4). The lapsed time is counted by the timer, and when a discharge set time period is reached (step Q5), the discharge processing section 32 turns off the switch 37 to stop discharging (step Q6). The discharge set time period counted by the timer is an extremely short time period for periodically and temporarily stopping the discharge in order to perform voltage measurement.

After the discharge stop (step Q6), the number-of-times management section 33 increments by 1 the number-of-times-of-discharge counter of the discharge processing section 32 (step Q7), and determines whether the count is lower than a count value set in advance (step Q8). The count value is a set number of times on the basis of which whether the number of times of discharge is in an appropriate range is determined. When the count is lower than the count value, the process returns to the DC voltage measurement process (step Q1), again, comparison with the threshold is performed (step Q2), and the above-described processes are repeated. When the count value of the number of times of discharge has reached the set count value in step Q8, the number-of-times management section 33 causes a warning portion such as a display panel or a sound generation means to issue a warning (step Q9). These processes are individually performed for all the batteries 2 connected in series in the power supply 1.

FIG. 5 shows another example of processes performed by the discharge processing section 32 (FIG. 1, FIG. 2). In the example shown in FIG. 5, steps R2 to R4 are performed by the comparison section 31, steps R5 to R8 are performed by the discharge processing section 32, and steps R9 to R11 are performed by the number-of-times management section 33.

In the example shown in FIG. 5, only the processes performed by the comparison section 31 are different from those in the example shown in FIG. 4, and the other processes are the same as those in the example shown in FIG. 4, and thus, only the differences will be described. In the example shown in FIG. 5, after the measurement (step R1) of DC voltage of the battery 2 performed by the voltage measurement section 21 of voltage sensor 7, the comparison section 31 determines whether DC voltages of all the batteries 2 connected in series have been measured (step R2), and when DC voltages of all the batteries 2 connected in series have not been measured, the process returns to the measurement process (step R1) and measurement of the remaining batteries 2 is performed. As to which batteries 2 have been measured, for example, each measured battery 2 is managed by use of a flag or the like provided for each battery 2. In addition, the measured DC voltage of each battery 2 is stored in a predetermined storage region.

When measurements of DC voltages of all the batteries 2 have been completed, the comparison section 31 obtains an average value of DC voltages of all the batteries 2 (step R3), and determines whether the measured DC voltage of each individual battery 2 is lower than a threshold, which is a value obtained by adding an addition value set in advance to this average value (step R4). When there is a battery 2 of which measured DC voltage is higher than the threshold, the switch 37 for the battery 2 is turned on and discharge is performed, as in the example shown in FIG. 4 (step R5). Step R3 in which the average value is obtained may be performed by one of the plurality of voltage sensors 7 and the calculation result may be used by each voltage sensor 7.

In each of the examples shown in FIG. 4 and FIG. 5, after discharge is started, whether to end the discharge is determined on the basis of the DC voltage of the battery 2. However, the discharge management section 22 may stop the discharge after a set time period from the discharge start, without determination of the discharge stop on the basis of the DC voltage.

Each of the degradation suppression devices having the above-described configurations is configured to perform discharge for battery 2 that has a high measured voltage, and thus, the voltage of each of the batteries 2 connected in series can be equalized. For example, with reference to FIG. 3 which shows the power supply 1 in a simplified manner, when DC voltages of the batteries 2 ($2_1$ to $2_4$) connected in series are $V_1$, $V_2$, $V_3$, and $V_4$, respectively, and only $V_2$ is higher than a reference value (the "threshold") for degradation determination, only the battery $2_2$ is discharged. Since the voltage of each battery 2 is equalized in this manner, degradation of the battery $2_2$, which has high voltage between terminals and of which degradation has progressed, can be prevented from being accelerated during charging or the like.

In a case where discharge is performed, if the discharge is turned off on the basis of a set time period, appropriate discharge can be performed by use of a simple component such as a timer. In a case where discharge is temporarily stopped at a constant interval during the discharge to measure battery voltage, and the discharge is caused to end in accordance with the determination result of the battery voltage (the examples shown in FIG. 4 and FIG. 5), voltage after the discharge of the battery 2 can be obtained more accurately than in a case where the discharge time period is controlled by a timer. Accordingly, degradation of the battery 2 can be more assuredly prevented.

As in the examples shown in FIG. 4 and FIG. 5, in a case where discharge is temporarily stopped at a constant interval during the discharge to measure battery voltage, and the discharge is stopped on the basis of comparison between the battery voltage and a threshold, if a warning portion is caused to issue a warning when the number of times of discharge has exceeded a set value as in the examples in FIG. 4 and FIG. 5, an abnormality in which appropriate voltage cannot be attained even through discharge can be quickly recognized by an operator, and thus, countermeasures can be taken early.

The current limiting resistor 36 and the switch 37 of the discharge section 30 may be mounted on the common circuit board 7A as that of a circuit element 21A (FIG. 1) forming the voltage measurement section 21. In this case, the degradation suppression device can be formed in a simple and compact manner. In the present embodiment, the discharging circuit 35 and the circuit, connected to the battery 2, in the voltage measurement section 21 are connected to the same positive and negative cables 38, and thus, the wiring system is simplified.

As in the example shown in FIG. 5, in a case where the threshold at which whether or not to perform discharge is determined is obtained by calculating an average value of DC voltages of all the batteries 2 and then adding a set addition value to this average value, it is possible to perform discharge such that more appropriate voltage is attained, than in a case where a threshold is determined in advance. Since the appropriate voltage range slightly varies depending on the individual power supply 1, in a case where the average value is used, it is possible to perform discharge such that more appropriate voltage is attained than in a case where a threshold is determined in advance. Accordingly, degradation suppression can be more assuredly realized. Since the threshold is obtained by adding a set addition value to the average value of DC voltages, it is possible to, even during charging, with respect to the batteries connected in series for which shared charge current is used, monitor the voltage between terminals and perform relative degradation determination.

Next, the entire of a secondary battery degradation determination device using this degradation suppression device is described with reference to FIG. 6 to FIG. 8. Description of the matters already described herein is omitted. In the present embodiment, as shown in FIG. 6, the controller 11 is formed by a main controller 11A having connected thereto the data server 13 and a monitor 14 via a communication network 12. The communication network 12 is implemented as a LAN such as a wireless LAN, and has a hub 12a. The communication network 12 may be a wide area network. Through the communication network 12 and other communication networks, the data server 13 can communicate with personal computers (not shown) and the like at remote places, and data therein can be monitored from any place. Preferably, communication between the main controller 11A and the data server 13 via the communication network 12 is assured through handshake.

Figure 7:
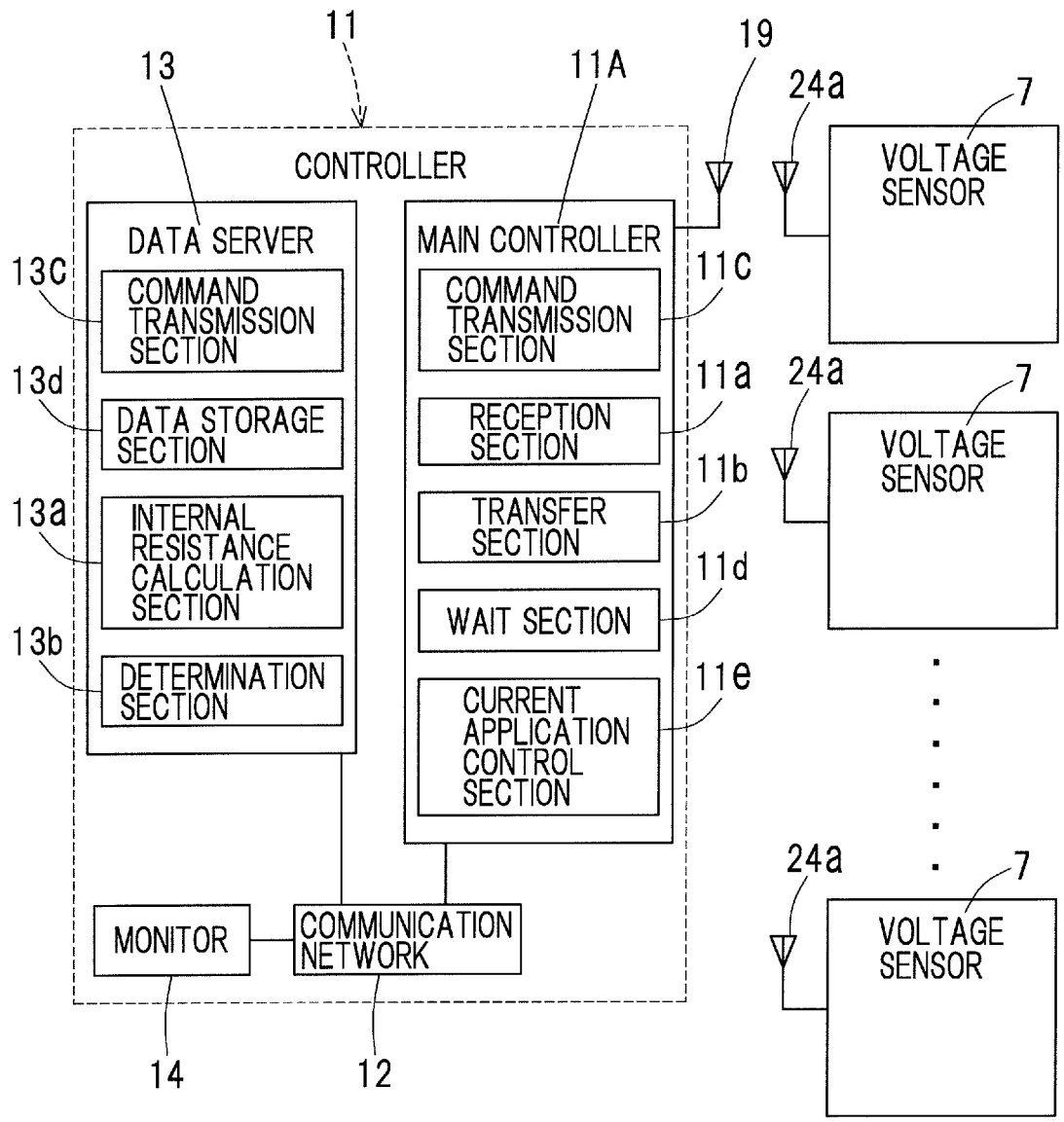
FIG. 7 is a block diagram showing relationship between a controller and the voltage sensor in the degradation suppression device.
Figure 8:
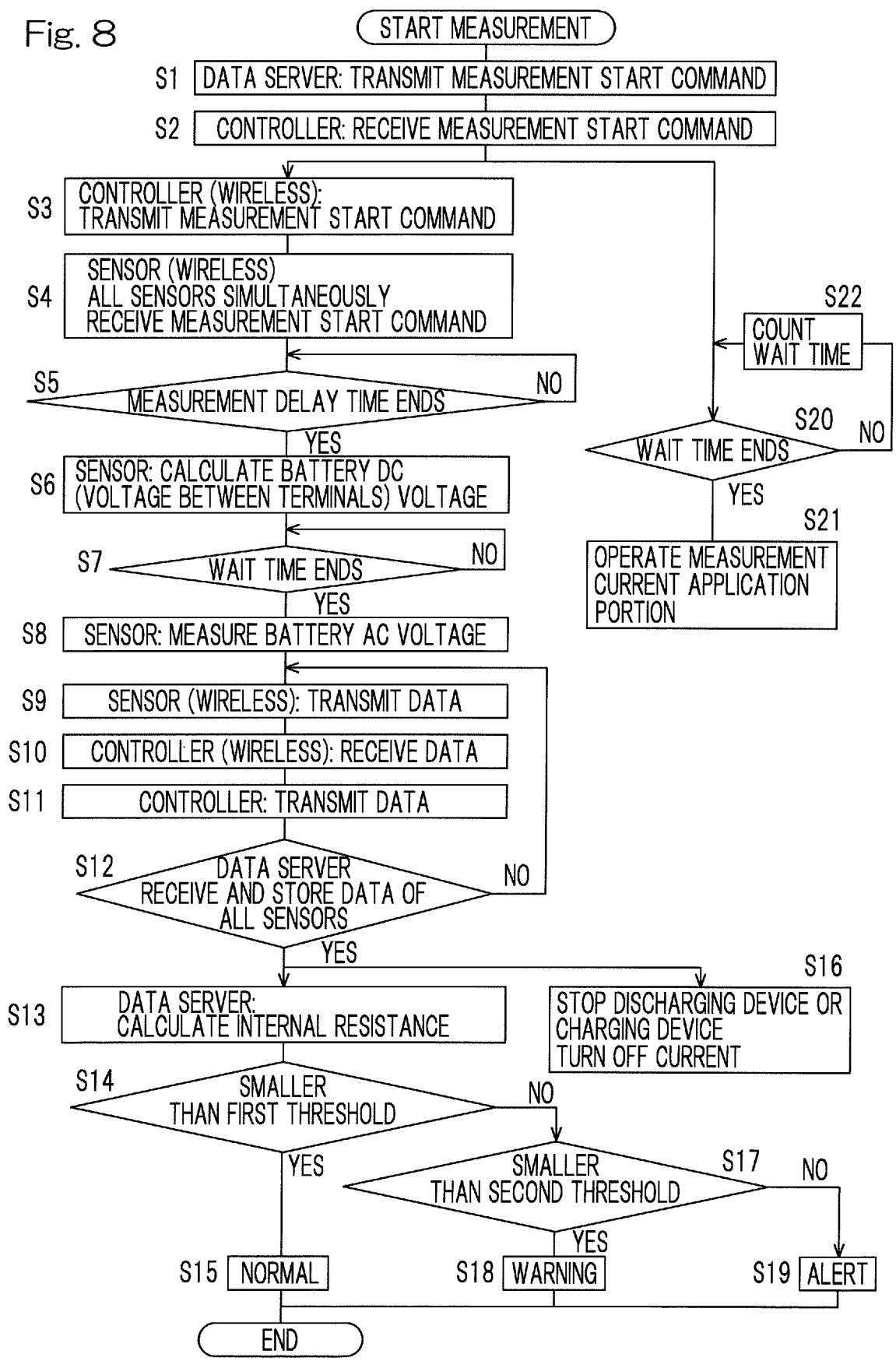
FIG. 8 is a flow chart showing an example of operation performed by the secondary battery degradation determination device shown in FIG. 6.

In FIG. 7, the main controller 11A includes a reception section 11a which receives a measurement value measured by each voltage sensor 7 transmitted from a corresponding wireless communication section 24 and a transfer section 11b which transfers the measurement value received by the reception section 11a to the communication network 12. The main controller 11A further includes a command transmission section 11c which wirelessly transmits a command such as a transmission start to the wireless communication section 24 of each voltage sensor 7, a wait section 11d described later and a current application control section 11e. The current application control section 11e controls the measurement current application portion 9 (FIG. 6). Wireless transmission and reception by the command transmission section 11c and the reception section 11a are carried out via an antenna 19.

As shown in FIG. 6, each current sensor 8 is connected through wiring to the main controller 11A, and the measurement value of the current is transferred together with a voltage measurement value from the transfer section 11b shown in FIG. 7. The command transmission section 11c of the main controller 11A may generate a command by itself, but in the present embodiment, in response to a measurement start command transmitted from the data server 13, the command transmission section 11c transfers the measurement start command to the wireless communication section 24 of each voltage sensor 7. It should be noted that the main controller 11A or each current sensor 8 is provided with a conversion section (not shown) which converts the measurement value measured by the current sensor 8 into an effective value or an average value.

As described above, the controller 11 has a function of transmitting the command to each wireless communication section 24, and the wireless communication section 24 has a function of providing, upon receiving the command, an instruction that corresponds to the command, to a calculation processing section (not shown) provided in the voltage sensor 7.

The data server 13 includes an internal resistance calculation section 13a and a determination section 13b. The internal resistance calculation section 13a calculates an internal resistance of the battery 2 in accordance with a predetermined calculation formula, using an AC voltage value (effective value or average value), a DC voltage value (cell voltage), a measured temperature, and a current value (effective value or average value) that have been transmitted from the main controller 11A and received by the internal resistance calculation section 13a. The measured temperature is used in temperature correction.

The determination section 13b determines that degradation has occurred when the calculated internal resistance is not less than a threshold which has been set. A plurality of the thresholds (for two to three stages, for example) are provided, degradation determination is performed in a plurality of stages, and alerts prepared in the plurality of stages are outputted as described later. The determination section 13b has a function of causing the monitor 14 to display a determination result via the communication network 12 or via dedicated wiring. In addition to the above, the data server 13 includes: a command transmission section 13c which transmits a measurement start command and a measurement end command to the main controller 11A; and a data storage section 13d for storing data such as the voltage measurement value transmitted from the main controller 11A.

In the configuration described above, the main controller 11A and the measurement current application portion 9 may be configured as an integrated controller housed in a single case. In the present embodiment, the controller 11 is configured to include the main controller 11A and the data server 13. However, the main controller 11A and the data server 13 may be configured as one controller 11 housed in a single case, or the main controller 11A and the data server 13 may be implemented, without being separated, as one information processing device formed on one board or the like.

Next, operation of this secondary battery degradation determination device is described with reference to FIG. 8. The data server 13 transmits a measurement start command from the command transmission section 13c (FIG. 7) (step S1). The main controller 11A receives the measurement start command from the data server 13 (step S2), and transmits the measurement start command to the wireless communication section 24 of each voltage sensor 7 and each current sensor 8 (step S3). In parallel with the process of this transmission and thereafter, the wait section 11d determines whether a wait time has ended (step S20) and counts the wait time (step S22). When the set wait time has ended, the measurement current application device 9 performs application of current (step S21). In this current application, discharge is started in a case where the measurement current application portion 9 is a discharging device, and charge is started in a case where the measurement current application portion 9 is a charging device.

The measurement start command transmitted in step S3 is received by all the voltage sensors 7 (step S4). Each voltage sensor 7 waits until its own measurement delay time ends (step S5), and measures DC voltage (voltage between terminals) of the battery 2 (step S6). Then, the voltage sensor 7 waits until the wait time ends (step S7), and measures AC voltage of the battery 2 (step S8). As for the measurement of AC voltage, a measurement value that has been directly obtained is converted into an effective voltage or an average voltage, and the converted value is outputted as a measurement value.

The measured DC voltage and AC voltage are wirelessly transmitted by the wireless communication section 24 after the transmission delay time for the voltage sensor 7 has elapsed (step S9), and are wirelessly received by the main controller 11A of the controller 11 (step S10). The main controller 11A transmits the received DC voltage and AC voltage to the data server 13, through the communication network 12 such as a LAN, together with the measurement value measured by the current sensor 8 (step S11). The data server 13 receives data sequentially transmitted from sensors such as the voltage sensors 7, and stores the data in the data storage section 13d (step S12). The steps from the wireless transmission in step S9 through the data storage performed by the data server 13 are performed until reception and storage of data from all the voltage sensors 7 end (NO in step S12).

After the reception and the storage have ended (YES in step S12), an end signal indicating the end is transmitted from the data server 13 to the main controller 11A and a current application control signal is outputted from the main controller 11A, whereby current application by the measurement current application portion 9 is turned off (step S16), and in the data server 13, the internal resistance of each battery 2 is calculated by the internal resistance calculation section 13a (step S13).

The determination section 13b of the data server 13 compares the calculated internal resistance with a first threshold predetermined as appropriate (step S14), and when the calculated internal resistance is smaller than the first threshold, the determination section 13b determines that the battery 2 is normal (step S15). When the calculated internal resistance is not smaller than the first threshold, the determination section 13b further compares the calculated internal resistance with a second threshold (step S17). When the calculated internal resistance is smaller than the second threshold, a warning, which is an alert for calling attention, is outputted (step S18). When the calculated internal resistance is not smaller than the second threshold, an alert, which is a stronger notification than a warning, is outputted (step S19). The alert and the warning are displayed on the monitor 14 (FIG. 6). When the battery 2 is normal, an indication that the battery 2 is normal may be displayed on the monitor 14, or may not be displayed in particular. The display of the alert and the warning on the monitor 14 may be performed by using a symbol such as a predetermined icon, or may be performed by lighting a predetermined portion, for example. In this manner, degradation determination regarding all the batteries 2 in the emergency power supply 1 is performed. FIG. 8 is an example of a two-stage degradation determination and display of an alert, etc.

According to the degradation determination device having this configuration, as described above, an AC component is applied with each battery 2 and voltage of the AC component is measured by a corresponding voltage sensor 7. By use of this measurement value, the internal resistance of the battery 2 is calculated and degradation of the battery 2 is determined on the basis of the internal resistance. Thus, degradation can be accurately determined. The internal resistance of the battery 2 has a close relationship with the capacity of the battery 2, that is, the degree of degradation, and thus, if the internal resistance is known, degradation of the battery 2 can be accurately determined. In addition, degradation is determined not for the entirety of the power supply 1 subjected to degradation determination but for each of the batteries 2. In this configuration, measurement current containing the AC component is generated, and the internal resistance of the battery 2 is measured to determine degradation, and thus, the measurement can be performed in a relatively simple configuration.

In the present embodiment, the voltage sensors 7 are provided for the respective batteries 2, and each receive and transmit data is made through wireless communication. Thus, even if the emergency power supply 1 includes several tens to several hundreds of batteries 2, there is no need to take into consideration the electric reference potential (ground level) for each battery 2. Thus, neither differential operation nor an isolation transformer is required. In addition, since the measurement value measured by each of the plurality of voltage sensors 7 is wirelessly transmitted, no complicated wiring is necessary. However, electric power consumption in each voltage sensor 7 is increased due to wireless communication, and thus, in a configuration in which electric power of a battery 2 subjected to determination is used for driving a corresponding voltage sensor 7, the increase of electric power consumption becomes further significant. Therefore, the effect of reducing the electric power consumption due to the provision of the discharge processing section 32, etc., which interrupts electric power supply only for a set time period in the present embodiment, is rendered to be further effective.

In the present embodiment, in a case where the measurement value measured by each voltage sensor 7 is converted into an effective value or an average value to be transmitted, the transmission data amount is significantly reduced, when compared with a case where a signal having a voltage waveform is sent. Calculation of the internal resistance of the battery 2 can be accurately performed by use of the effective value or the average value. Also in a case where such a conversion section 29 is provided, the electric power consumption by the IC (CPU, for example) forming the conversion section 29 becomes a significance, and thus, the effect of reducing the electric power consumption due to the provision of the discharge processing section 32, etc., which interrupts electric power supply only for a set time period in the present embodiment, is rendered to be effective.

Control of the voltage sensor 7 is performed by use of the measurement start command and the measurement end command as described above, and thus, voltage measurements respectively performed by a large number of voltage sensors 7 can be carried out at appropriate timings.

For obtaining internal resistance of the battery 2, even in a case where only voltage is measured, the internal resistance of the battery 2 can be calculated with, for example, an assumption that current has a constant value. However, if the current actually flowing in the battery 2 is measured and both the voltage and the current are obtained, the internal resistance can be more accurately calculated. Since the current flowing in the batteries arranged in series is the same, it is sufficient that one current sensor 8 is provided for each battery group 3. Since the current sensor 8 is provided not for each battery 2 but for each battery group 3, the number of current sensors 8 is small, and a wired configuration thereof causes no wiring difficulties.

According to this secondary battery degradation determination device, the following effects can be further obtained. The controller 11 transmits a measurement start command to the wireless communication section 24 of each voltage sensor 7, and this command causes measurement of the voltage sensor 7 to start. Accordingly, measurement start timings of the voltage sensors 7 that exist by a large number can be adjusted. In this case, the controller 11 simultaneously transmits, in serial transmission or parallel transmission, the measurement start command to each voltage sensor 7, and each voltage sensor 7 simultaneously performs measurement after a lapse of a measurement start delay time. After the measurement has ended, the controller 11 sequentially transmits a data transmission request command to each voltage sensor 7, the voltage sensor 7 that has received the command transmits data, and this procedure is repeated, whereby data communication may be performed. In the present invention, after a certain time period from the transmission of the data transmission request command, the controller 11 may send a re-transmission request to a voltage sensor 7 from which data has not been received.

As another example, in a case where measurement is performed after a lapse of only a measurement start delay time that is predetermined for each voltage sensor 7, even when a measurement start command is simultaneously transmitted to each wireless communication section 24, measurements respectively performed by the large number of voltage sensors 7 can be sequentially carried out and transmission can be carried out such that wireless transmission and reception are not hindered. For example, a transmission start command is a global command, and is simultaneously obtained by each voltage sensor 7.

After a certain time period from the transmission of the measurement start command, the controller 11 sends a re-transmission request to a voltage sensor 7 from which data has not been received. There are cases where, due to some temporary transmission failure or the like, the wireless communication sections 24 of some of the voltage sensors 7 cannot receive the measurement start command. Even in such a case, if the re-transmission request is sent, voltage can be measured and transmitted, and thus, voltage measurement values of all the batteries 2 in the power supply can be obtained. Whether or not the measurement start command has been successfully received may be determined, on the controller 11 side, on the basis of whether or not a voltage measurement value has been received.

Instead of simultaneously transmitting the measurement start command as described above, the controller 11 may individually transmit a data request command to the wireless communication section 24 of each voltage sensor 7, and may receive data sequentially. In this configuration, the delay section 28 at the voltage sensor 7 side is not necessary, and the configuration at the voltage sensor 7 side is simplified. Since the controller 11 outputs an alert prepared in a plurality of stages, in accordance with the magnitude of the calculated internal resistance, urgency of the need of battery replacement can be recognized. Thus, without performing unnecessary battery replacement, it is possible to perform maintenance planning and preparation smoothly and quickly.

In the above embodiment, a case has been described in which the power supply 1 is an emergency power supply and trickle charging is performed. However, the power supply 1 may be a power supply that employs float charging. In addition, the secondary battery degradation suppression device of the present invention can be applied not only to an emergency power supply but also a general power supply in which a plurality of batteries 2, which are secondary batteries, are connected in series.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

REFERENCE NUMERALS

1 . . . power supply
2 . . . battery
3 . . . battery group
4 . . . load
5 . . . main power supply
5A, 5B . . . terminal
6 . . . charging circuit
7 . . . voltage sensor (individual degradation suppression device)
7A . . . circuit board
8 . . . current sensor
9 . . . measurement current application portion
11 . . . controller
11A . . . main controller
11a . . . reception section
11b . . . transfer section
11c . . . command transmission section
11d . . . wait section
11e . . . current application control section
12 . . . communication network
13 . . . data server
13a . . . internal resistance calculation section
13b . . . determination section
14 . . . monitor
15 . . . diode
20 . . . -measurement-control section
21 . . . voltage measurement section
21A . . . circuit element
22 . . . discharge management section
23 . . . calculation control section
24 . . . wireless communication section
25 . . . AC voltage measurement section
26 . . . DC voltage measurement section
27 . . . control section
28 . . . delay section
29 . . . conversion section
30 . . . discharge section
31 . . . comparison section
32 . . . discharge processing section
33 . . . number-of-times management section
33a . . . main power supply switch
35 . . . discharging circuit
36 . . . current limiting resistor
37 . . . switch
38 . . . cable

What is claimed is:

1. A secondary battery degradation suppression device configured to suppress degradation of batteries in a power supply where the plurality of batteries connected in series, each battery being a secondary battery,
the secondary battery degradation suppression device comprising:
a plurality of individual degradation suppression devices connected to the respective batteries, wherein
each individual degradation suppression device includes
a voltage measurement section configured to measure DC voltage between terminals of the battery,
a comparison section configured to compare, with a threshold, the voltage measured by the voltage measurement section and determine whether the voltage is higher than the threshold, and
a discharge section configured to discharge the battery when the comparison section has determined that the voltage is higher than the threshold;
the discharge section includes
a discharging circuit implemented as a series circuit of a current limiting resistor and a switch and connected in parallel to the battery, and
a discharge management section configured to control the discharging circuit; and
the discharge management section includes
a discharge processing section configured to
turn on the switch to connect the battery and the current limiting resistor when the comparison section has determined that the measured voltage is higher than the threshold, and, while the switch is on, to temporarily turn off the switch at a constant interval to allow voltage measurement by the voltage measurement section and comparison by the comparison section to be performed again, and
maintain an off-state of the switch when the comparison section has determined that the measured voltage is lower than the threshold, and turn on the switch again, when the comparison section has determined that the measured voltage is higher than the threshold, thereby to repeat processes of the temporary turning off at the constant interval, the allowing of voltage measurement and comparison.

2. The secondary battery degradation suppression device as claimed in claim 1, wherein
the discharge section includes:
a discharging circuit implemented as a series circuit of a current limiting resistor and a switch and connected in parallel to the battery; and a discharge management section configured to control the discharging circuit, and the discharge management section includes:
the comparison section; and
a discharge processing section configured to turn on the switch when the comparison section has determined that the measured voltage is higher than the threshold, and to turn off the switch after a set time period.

3. The secondary battery degradation suppression device as claimed in claim 1, comprising
a number-of-times management section configured to count the number of times of discharge in which the switch is turned on through repetition of the processes performed by the discharge processing section, and to cause a warning portion to issue a warning when the number of times of discharge has reached a set value.

4. The secondary battery degradation suppression device as claimed in claim 1, wherein
the discharge section includes a discharging circuit implemented as a series circuit of a current limiting resistor and a switch and connected in parallel to the battery, and
the current limiting resistor and the switch are mounted on a common circuit board as that of the voltage measurement section.

5. The secondary battery degradation suppression device as claimed in claim 1, wherein
the discharge section includes a discharging circuit implemented as a series circuit of a current limiting resistor and a switch and connected in parallel to the battery, and
the discharging circuit and a circuit, connected to the battery, of the voltage measurement section are connected to a common cable.

6. The secondary battery degradation suppression device as claimed in claim 1, wherein
the voltage measurement section has a function of measuring voltage of an AC component applied between terminals of the battery.

7. The secondary battery degradation suppression device as claimed in claim 6 comprising
a wireless communication section configured to wirelessly transmit the voltage of the AC component measured by the voltage measurement section.

8. The secondary battery degradation suppression device as claimed in claim 1, wherein
the comparison section calculates an average value of DC voltages of all the batteries measured by the voltage measurement sections of the respective individual degradation suppression devices, and obtains the threshold by adding a set addition value to the calculated average value.

9. A secondary battery degradation suppression device configured to suppress degradation of batteries in a power supply where the plurality of batteries connected in series, each battery being a secondary battery,
the secondary battery degradation suppression device comprising:
a plurality of individual degradation suppression devices connected to the respective batteries; and
each individual degradation suppression device includes
a voltage measurement section configured to measure DC voltage between terminals of the battery,
a comparison section configured to compare, with a threshold, the voltage measured by the voltage measurement section and determine whether the voltage is higher than the threshold,
a discharge section configured to discharge the battery when the comparison section has determined that the voltage is higher than the threshold,
a measurement current application portion configured to apply current having an AC component to a battery group in which a plurality of the batteries are connected in series,
an internal resistance calculation section configured to calculate an internal resistance of each battery on the basis of voltage of the AC component measured by the voltage measurement section, and
a determination section configured to determine degradation of the battery on the basis of the internal resistance calculated by the internal resistance calculation section.

10. A secondary battery individual degradation suppression device configured to suppress degradation of a battery which is a secondary battery, the secondary battery individual degradation suppression device comprising:
a voltage measurement section configured to measure DC voltage between terminals of the battery;
a comparison section configured to compare, with a threshold, the voltage measured by the voltage measurement section and determine whether the voltage is higher than the threshold; and
a discharge section configured to discharge the battery when the comparison section has determined that the voltage is higher than the threshold, wherein
the discharge section includes:
a discharging circuit implemented as a series circuit of a current limiting resistor and a switch and connected in parallel to the battery; and
a discharge management section configured to control the discharging circuit, and
the discharge management section includes:
the comparison section; and
a discharge processing section configured to turn on the switch to start discharge when the comparison section has determined that the voltage is higher than the threshold, and configured to stop a discharge process when a predetermined discharge condition is satisfied, and
the discharge processing section is further configured to turn on the switch to connect the battery and the current limiting resistor when the comparison section has determined that the measured voltage is higher than the threshold, and, while the switch is on, to temporarily turn off the switch at a constant interval to allow voltage measurement by the voltage measurement section and comparison by the comparison section to be performed again, and maintain an off-state of the switch when the comparison section has determined that the measured voltage is lower than the threshold, and turn on the switch again, when the comparison section has determined that the measured voltage is higher than the threshold, thereby to repeat processes of the temporary turning off at the constant interval, the allowing of voltage measurement and comparison.

* * * * *